United States Patent
Dua et al.

(10) Patent No.: US 7,636,641 B1
(45) Date of Patent: Dec. 22, 2009

(54) DATA COMPACTION TECHNIQUES

(75) Inventors: Praveen Dua, Cupertino, CA (US); David Nakahira, San Jose, CA (US); James Hoffman, Sunnyvale, CA (US); Fiona Cain, San Jose, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 1262 days.

(21) Appl. No.: 10/456,009

(22) Filed: Jun. 5, 2003

(51) Int. Cl.
    G01D 21/00 (2006.01)
    G01P 21/00 (2006.01)
    G01R 35/00 (2006.01)

(52) U.S. Cl. .................................................... 702/86

(58) Field of Classification Search ............... 702/85, 702/86, 106, 189, 190, 60, 70, 75, 179, 180, 702/191; 703/2, 14, 21; 710/68; 709/247
See application file for complete search history.

(56) References Cited

U.S. PATENT DOCUMENTS

| | | | |
|---|---|---|---|
| 5,433,209 A * | 7/1995 | Gallant et al. | 600/524 |
| 5,623,935 A | 4/1997 | Faisandier | |
| 6,654,713 B1 | 11/2003 | Rethman et al. | |
| 6,771,930 B2 | 8/2004 | Buer | |
| 6,789,052 B1 | 9/2004 | Toprac | |
| 7,103,314 B2 * | 9/2006 | Li | 455/41.2 |
| 2004/0139110 A1 * | 7/2004 | LaMarca et al. | 707/104.1 |
| 2007/0096961 A1 * | 5/2007 | Sakiyama et al. | 341/76 |

* cited by examiner

Primary Examiner—Michael P Nghiem
(74) Attorney, Agent, or Firm—Bever, Hoffman & Harms, LLP; Jeanette S. Harms

(57) ABSTRACT

Many areas of technology need highly accurate data compression to provide small, multifunctional devices. In the area of communication governed by the IEEE 802.11 standards, a wireless device could significantly improve its performance by using its calibration data. Moreover, because of the increased mobility of users, a wireless device should be able to operate in different regulatory domains. This flexibility requires access to significant amounts of data regarding such regulatory domains. Advantageously, piecewise linear abstraction and/or mapping can be used to significantly reduce the amount of stored data while ensuring accuracy in reproducing the total data at a later point in time.

19 Claims, 11 Drawing Sheets

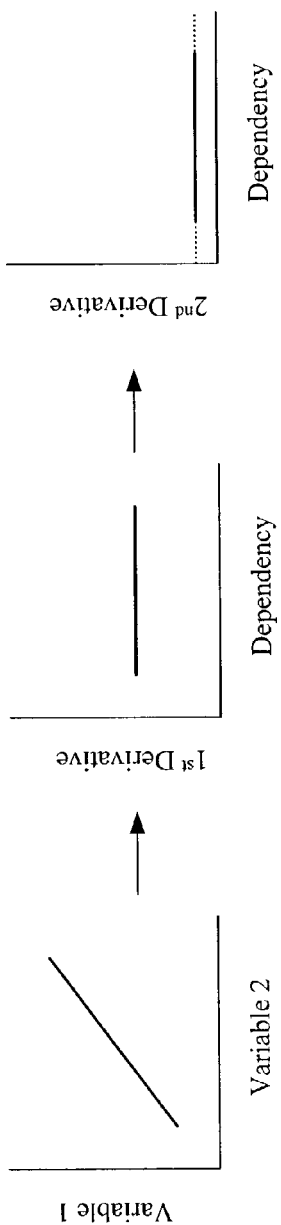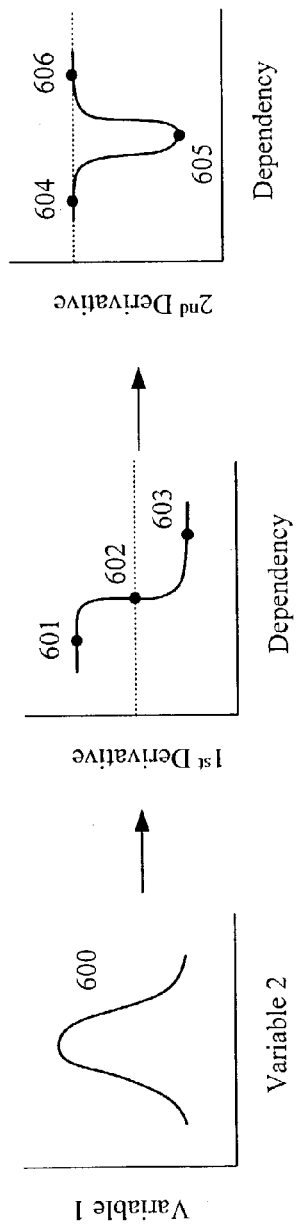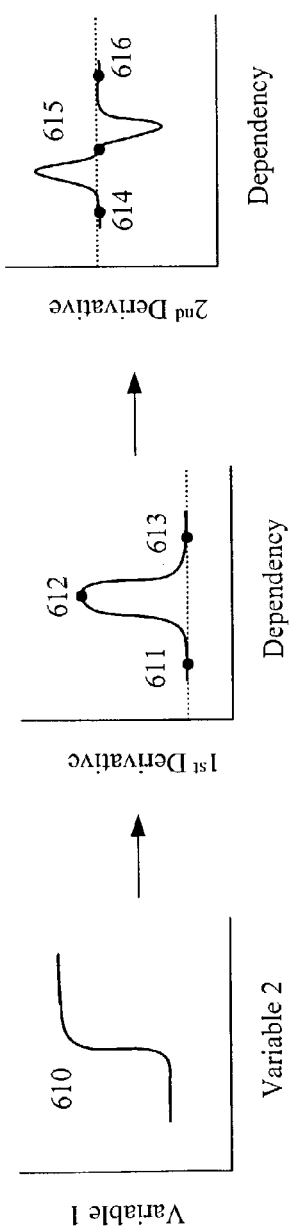
Figure 6A
Figure 6B
Figure 6C

DATA COMPACTION TECHNIQUES

BACKGROUND OF THE INVENTION

1. Field of the Invention

The present invention relates to data compaction and particularly to techniques that can use piecewise linear abstraction or mapping to accurately compress data.

2. Discussion of the Related Art

To operate optimally, certain parameters need to be set and/or adjusted in many electronic devices. In general, a set of operations, called a calibration, can be performed with the parameters under specified conditions. The calibration establishes a relationship between values provided by a measuring instrument and corresponding values provided by one or more standards.

In some devices, calibration is necessary not only for optimization, but also for basic operation. For example, due to the sensitive nature of radio frequency (RF) circuit design, each station or access point in a wireless network should be calibrated to guarantee its performance. Specifically, the dependence of a device's output power over its frequency range can have significant variation. Of importance, because such dependencies arise from statistical variations of parameters and their interplay, the exact dependency can vary from one device to another device. Thus, providing a fixed calibration for a plurality of devices could be highly ineffectual in adjusting a specific device. However, storing calibration data for a device can require significant memory resources, thereby increasing manufacturing and, ultimately, device costs.

Therefore, a need arises for a technique that provides highly compacted calibration data for each device, thereby allowing device manufacturers to deliver the highest level of performance accuracy tailored for that device.

SUMMARY OF THE INVENTION

Many areas of technology need highly accurate data compression to provide small, multifunctional devices. For example, in the area of communication governed by the IEEE 802.11 standards, a wireless device could significantly improve its performance by using its calibration data. Moreover, because of the increased mobility of users, a wireless device should be able to operate in different regulatory domains. This flexibility requires access to significant amounts of data regarding such regulatory domains. Therefore, in accordance with one aspect of the invention, piecewise linear abstraction and/or mapping can be used to significantly reduce the amount of stored data while ensuring accuracy in reproducing the total data at a later point in time.

In piecewise linear abstraction, a representation of the dependence between two variables is extracted. A dependence (or dependency) refers to a sampling of points at which a dependent variable is measured with respect to an independent variable. One example of a dependence includes the output power of a wireless transmitter (the dependent variable) measured over a range of frequencies (the independent variable). To reduce the data needed to represent this dependency, certain sampling points, called turning points, can be identified and selected for storage. Advantageously, a reasonably accurate value between two turning points can be determined by interpolating from the values at the two turning points.

The piecewise linear abstraction technique can include filtering anomalous sampling points, thereby minimizing any potential skew in subsequent data processing. Second derivatives of the dependence can then be computed, thereby generating a plurality of extrema (i.e. potential turning points) from the plurality of sampling points. Cost functions for the extrema can be computed.

At this point, the extrema can be sorted based on the cost functions. In one embodiment, extrema below a certain threshold can be filtered out before computing the cost functions, thereby leaving only significant extrema to be sorted. A set of the extrema can then be selected based on either a predetermined number of turning points or a certain level of accuracy to be provided by the set.

In one embodiment, the data can include a plurality of curves (i.e. multiple dependencies over the same range of the independent variable), wherein each curve represents a different value of a parameter. For example, in the case of a wireless device, the parameter could be a power control digital-to-analog converter (PCDAC) value, which can control the output power level of the device. In this case, significant extrema can be consolidated from multiple curves at certain independent variable sampling points (e.g. frequency piers).

A storage device readable by a software driver can also be provided. The storage device can store data representing a plurality of sampling points. Of importance, the data can be compressed using a method including piecewise linear abstraction. For example, the method can include computing second derivatives from the plurality of sampling points, thereby generating a plurality of extrema, computing cost functions for the extrema, sorting the plurality of extrema based on the cost functions, and selecting a set of the extrema based on either a predetermined number of turning points or a level of accuracy to be provided by the set. The storage device could be an EEPROM or a flash memory. In one embodiment, the data includes calibration data regarding a wireless device.

A computer program product in accordance with one embodiment of the invention can also be provided. The computer program product can include a computer usable medium having a computer readable program code embodied therein for causing a computer to compress data regarding a wireless device. The computer readable program code can include computer readable program code that accesses data including a plurality of sampling points, computer readable program code that computes second derivatives from the plurality of sampling points, thereby generating a plurality of extrema, computer readable program code that computes cost functions for the extrema, computer readable program code that sorts the extrema based on the cost functions, and computer readable program code that selects a set of the extrema based on one of a predetermined number of turning points and an accuracy to be provided by the set.

In one embodiment, the data can include a plurality of curves, wherein each curve can represent a dependence of a dependent variable on an independent variable. In this case, the computer program product can further include computer readable program code that forms piers at certain values of the independent variable. In another embodiment, the computer program product can further include computer readable program code that processes the data to exclude anomalous sampling points before computing the second derivatives. In yet another embodiment, the computer program product can further include computer readable program code that filters out insignificant extrema before computing the cost functions, thereby leaving significant extrema to be sorted.

A system for compressing calibration data regarding a wireless device can also be provided. The system can include means for accessing data including a plurality of sampling points, means for computing second derivatives from the plurality of sampling points, thereby generating a plurality of extrema, means for computing cost functions for the plurality of extrema, means for sorting the plurality of extrema based on the cost functions, and means for selecting a set of the plurality of extrema based on one of a predetermined number of turning points or a level of accuracy to be provided by the set.

In accordance with another aspect of the invention, a mapping technique for compressing conformance testing limit (CTL) data is described. The method can include representing each band of a regulatory domain as a pair of band edges. In-band frequencies, if present, can be designated within each band. Of importance, at least two non-overlapping regulatory domains can be provided in the CTL. In one embodiment, the method can further include providing at least two completely contained or overlapping regulatory domains with equivalent constraints in one CTL. By providing non-overlapping regulatory domains and/or completely contained/overlapping regulatory domains, multiple regulatory domains can be advantageously mapped to the same CTL. Designating an in-band frequency can include providing a non-edge flag value different than that for a band edge.

A storage device that stores conformance testing limit (CTL) data is also described. The CTL data includes at least two non-overlapping regulatory domains, wherein each band of a regulatory domain can be represented as a pair of band edges and in-band frequencies can be represented within each band. In one embodiment, further compression can be achieved by including at least two completely contained or overlapping regulatory domains with equivalent constraints in the CTL.

A computer program product that includes computer readable program code for causing a computer to compress conformance testing limit (CTL) data for a wireless device is also described. The computer readable program code can include computer readable program code that represents each band of a regulatory domain as a pair of band edges, computer readable program code that designates in-band frequencies within each band, and computer readable program code that provides at least two non-overlapping regulatory domains in the CTL. In one embodiment, the computer program product can further include computer readable program code that provides at least two completely contained or overlapping regulatory domains with equivalent constraints in the CTL.

A system for compressing conformance testing limit (CTL) data for a wireless device is also described. The system can include means for representing each band of a regulatory domain as a pair of band edges, means for designating in-band frequencies within each band, and means for providing at least two non-overlapping regulatory domains in the CTL.

BRIEF DESCRIPTION OF THE FIGURES

FIGS. 6A-6C illustrate exemplary first and second derivations of various dependencies.

DETAILED DESCRIPTION OF THE FIGURES

The storage of data is becoming critical in many areas of technology. Specifically, because users want smaller devices to store increasingly more data, improved compaction techniques are in great demand. In accordance with one aspect of the invention, piecewise linear abstraction and/or mapping can be used to efficiently reduce the amount of stored data while ensuring accuracy in reproducing the total data at a later point in time.

Overview of Piecewise Linear Abstraction

Figure 1:
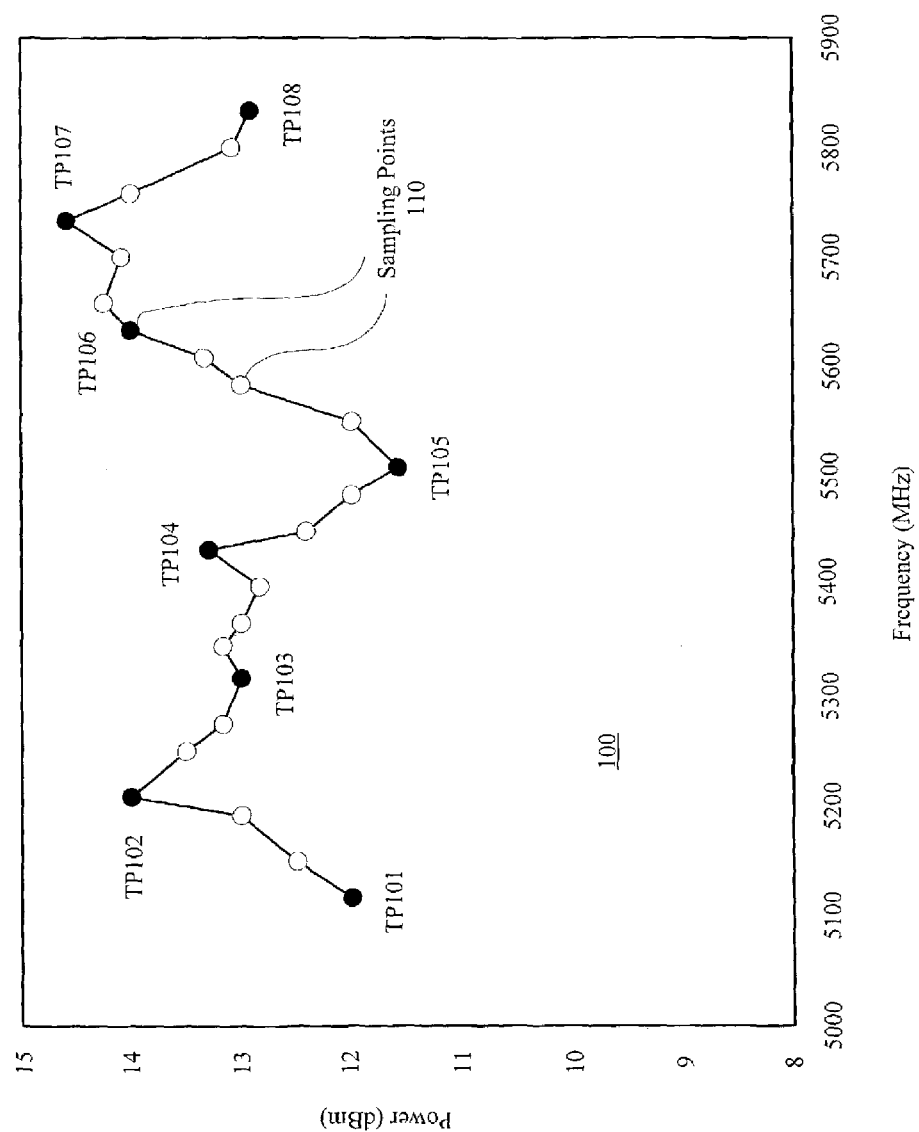
FIG. 1 illustrates an exemplary dependence, in this case between power and frequency, as well as turning points to accurately capture the data of the dependence. The turning points were chosen from a plurality of sampling points using piecewise linear abstraction.

A dependence of two variables can be represented graphically, typically by plotting multiple sampling points using an x-y coordinate system, wherein the x-axis represents an independent variable and the y-axis represents a dependent variable. For example, FIG. 1 illustrates an exemplary dependence (also called a dependency herein) of power and frequency represented by a graph 100. Multiple sampling points 110 can be plotted on graph 100.

To reduce the data needed to represent this dependency, certain sampling points, called turning points, can be identified and selected for storage. In graph 100, turning points TP101-TP108 (only circles with a black fill pattern) have been selected from sampling points 110. Advantageously, a reasonably accurate value between two turning points can be determined by interpolating from the values of the two turning points. For example, if a device needed to know the appropriate power when it operates at a frequency of 5600 MHz, then the device could interpolate the power/frequency values of TP105 and TP106. Turning point TP105 has a frequency of 5520 with an associated power of 11.5 dBm, whereas turning point TP106 has a frequency of 5630 with an associated power of 14.0 dBm. Thus, by interpolating between turning points TP105 and TP106, the device could determine that at 5600 MHz, it should operate at approximately 13.2 dBm.

Storing the turning points instead of all sampling points provides the following advantages. First, the number of turning points can be significantly fewer than the total number of sampling points. For example, in graph 100, eight turning points (i.e. TP101-TP108) are selected from twenty-four sampling points. Second, the number of turning points can be adjusted to attain an appropriate balance between data compaction and accuracy. In other words, selecting additional turning points can increase the accuracy in interpolation, but can decrease the compaction of the data. In contrast, selecting fewer turning points can decrease the accuracy in interpolation, but can increase the compaction of the data.

In one embodiment, the number of turning points can be user determined. In another embodiment, certain areas of the dependency could be targeted. For example, if greater power accuracy between 5300 and 5440 MHz were desired, than one or more additional turning points could be identified and selected between turning points TP103 and TP104. In one embodiment, the number of turning points can be based on a certain minimum level of accuracy required of the interpolated values. In this case, the actual number of turning points will depend upon the actual dependency to be represented. Specifically, a dependency that has widely varying dependent values within a certain range of independent values would typically have more turning points than a dependency that has few varying dependent values within the same range of independent values.

Note that because turning points are selected to minimize the overall error in interpolating values, some turning points may not correspond to significant changes in direction of the dependency. For example, turning point TP106 does not correspond to a significant change in direction (e.g. a change from positive to negative slope). However, turning point TP106 does provides the best approximated interpolation for values between turning points TP105/TP106 and TP106/TP107.

Piecewise Linear Abstraction Applied to a Set of Curves

Figure 2:
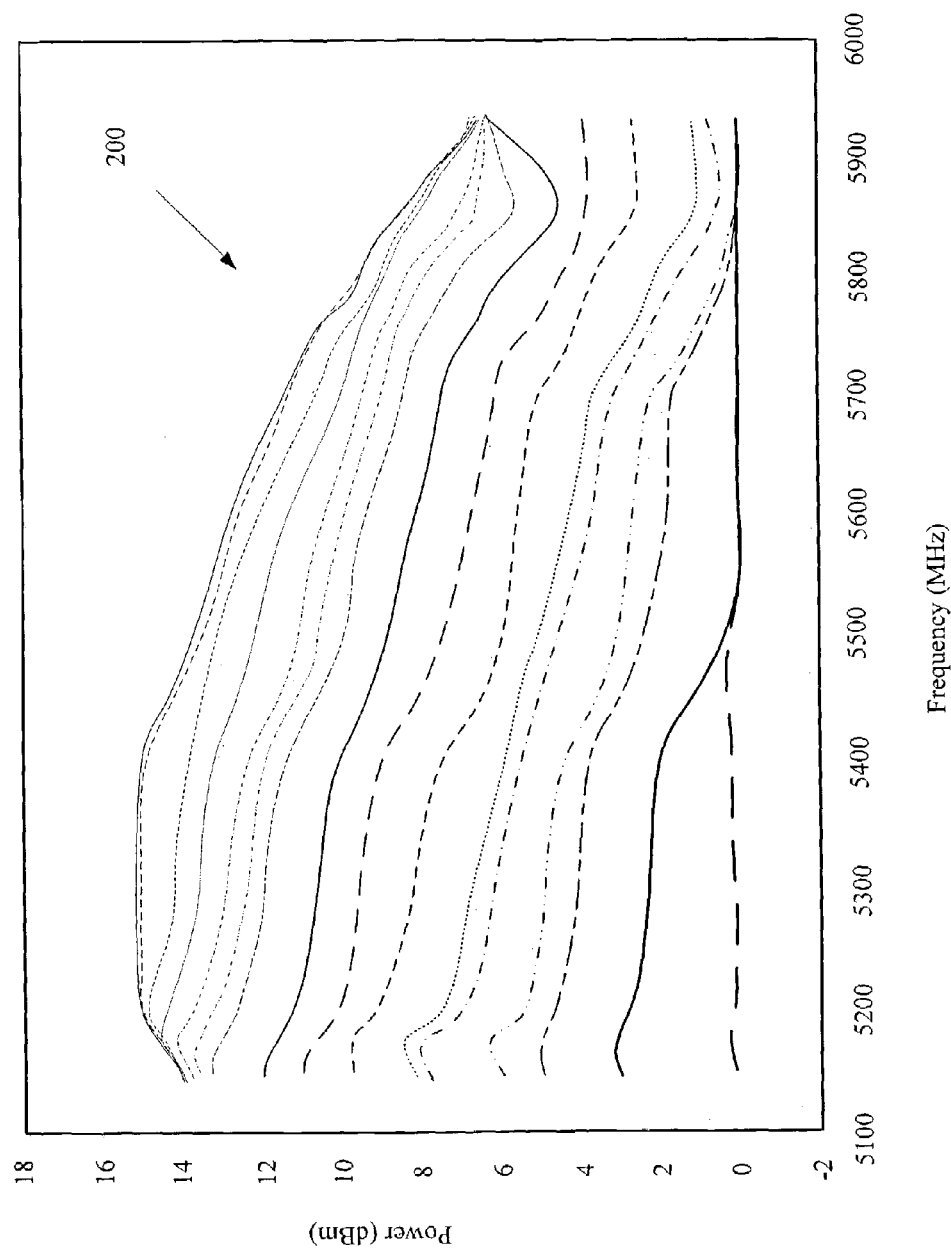
FIG. 2 illustrates a set of curves, wherein each curve represents a different PCDAC parameter.
Figure 3:
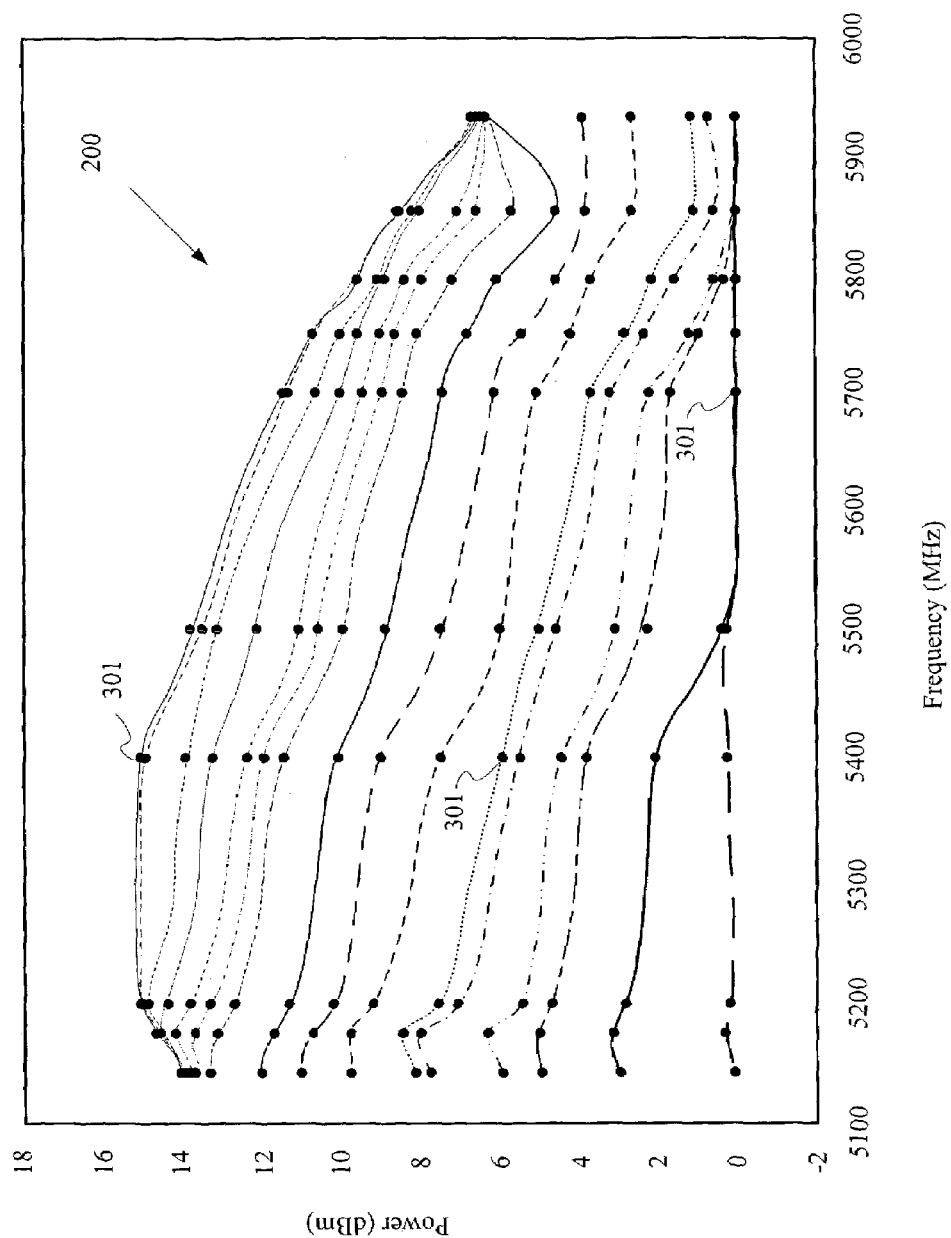
FIG. 3 illustrates turning points at predetermined piers that may be chosen from the set of curves of FIG. 2 using a cost function.

FIGS. 2 and 3 illustrate how the piecewise linear abstraction technique can be applied to a set of curves. Specifically, FIG. 2 illustrates a set of curves 200, wherein each curve represents a different value of a parameter. In this case, the parameter is a power control digital-to-analog converter (PCDAC). The PCDAC value can be thought of as a "throttle" that controls power conversion. In other words, the level of power in a wireless device can be controlled by the PCDAC values. In one embodiment, curves 200 can be measured during a calibration of the wireless device. (Note that each of curves 200 can be comprised of hundreds or even thousands of sampling points, which are not shown for simplicity in FIGS. 2 and 3).

FIG. 3 illustrates the set of curves 200, but also indicates a plurality of turning points 301 for those curves at certain chosen frequencies, called "frequency piers". Of importance, turning points 301 for one of curves 200 may be initially identified at frequencies different than those of the frequency piers. However, to provide yet additional compaction of the data, frequency piers can be determined for the set of curves 200.

Figure 5A:
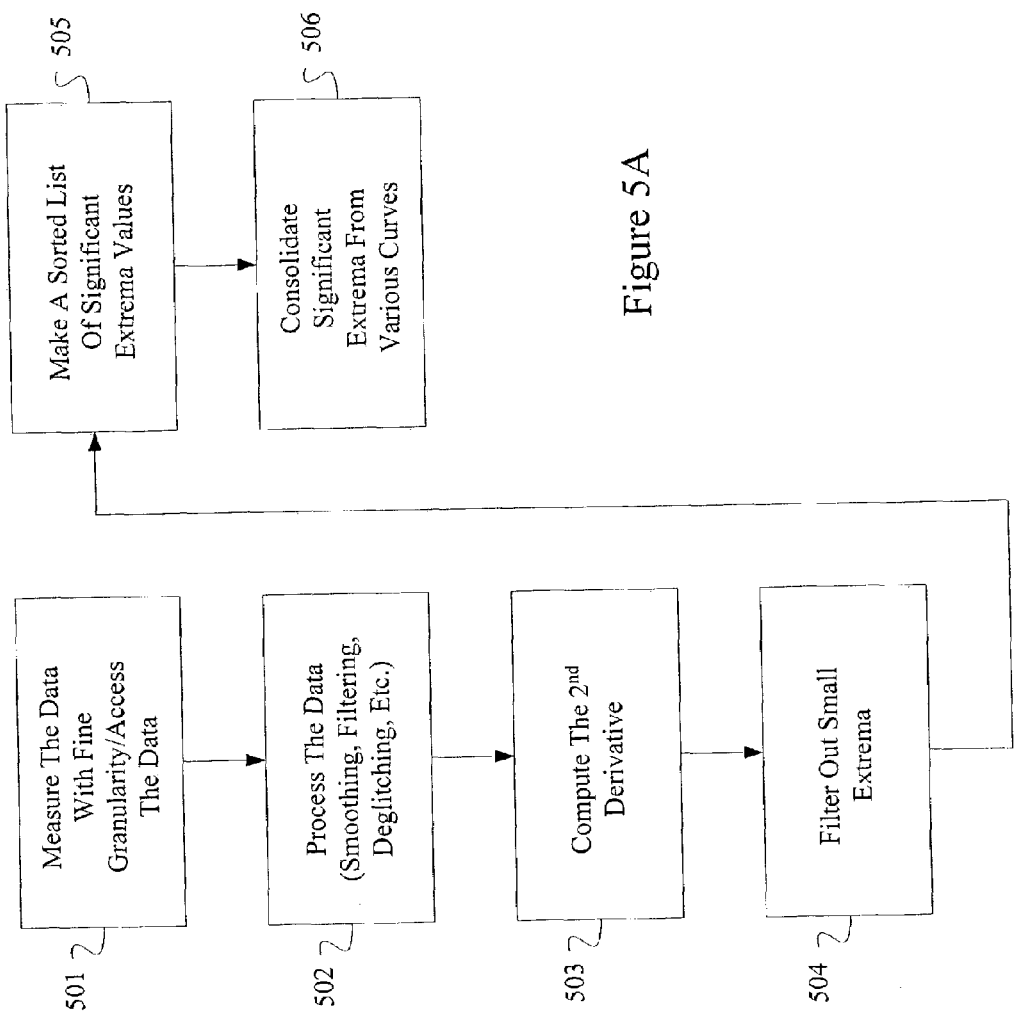
FIGS. 5A and 5B illustrate an exemplary technique for computing a set of turning points using piecewise linear abstraction.
Figure 5B:
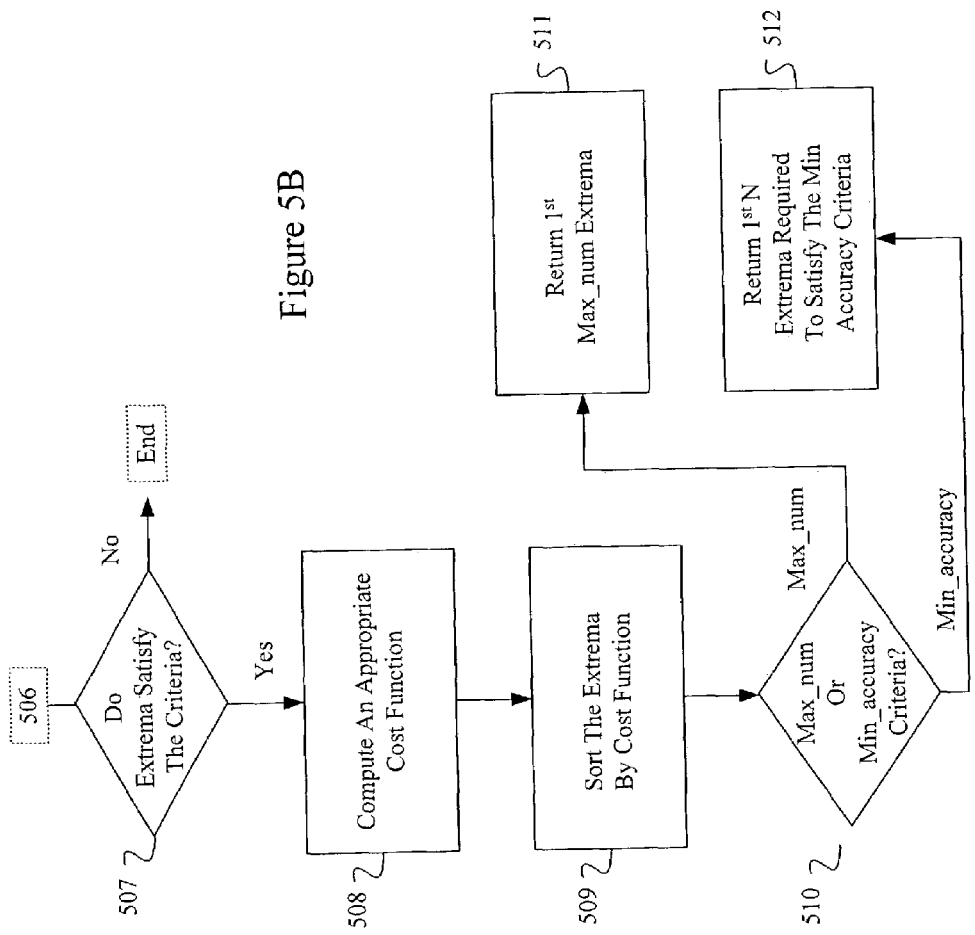

In general, to determine the frequency piers for a set of curves, the original dependencies can be measured, e.g. during calibration, or accessed. For example, in one embodiment, as part of the manufacturing calibration, the dependence of output power over frequency could be measured over 4.9 GHz to 5.85 GHz (i.e. for the 802.11a mode) in steps of 30 MHz for a plurality of PCDACs (e.g. from 1 to 63). The piecewise linear abstraction for each curve can be computed, thereby generating a plurality of potential turning points for each curve. At this point, the cost of not choosing a potential turning point can be computed. This cost function, which is effectively an error approximation, can be computed for each potential turning point of the set of curves. Then, the potential turning points can be sorted based on their cost. The potential turning points having a high cost at substantially the same frequency can form a frequency pier. FIGS. 5A and 5B describe the piecewise linear abstraction technique in greater detail.

Additional Compression Percentage Intercepts of Curves

Figure 4A:
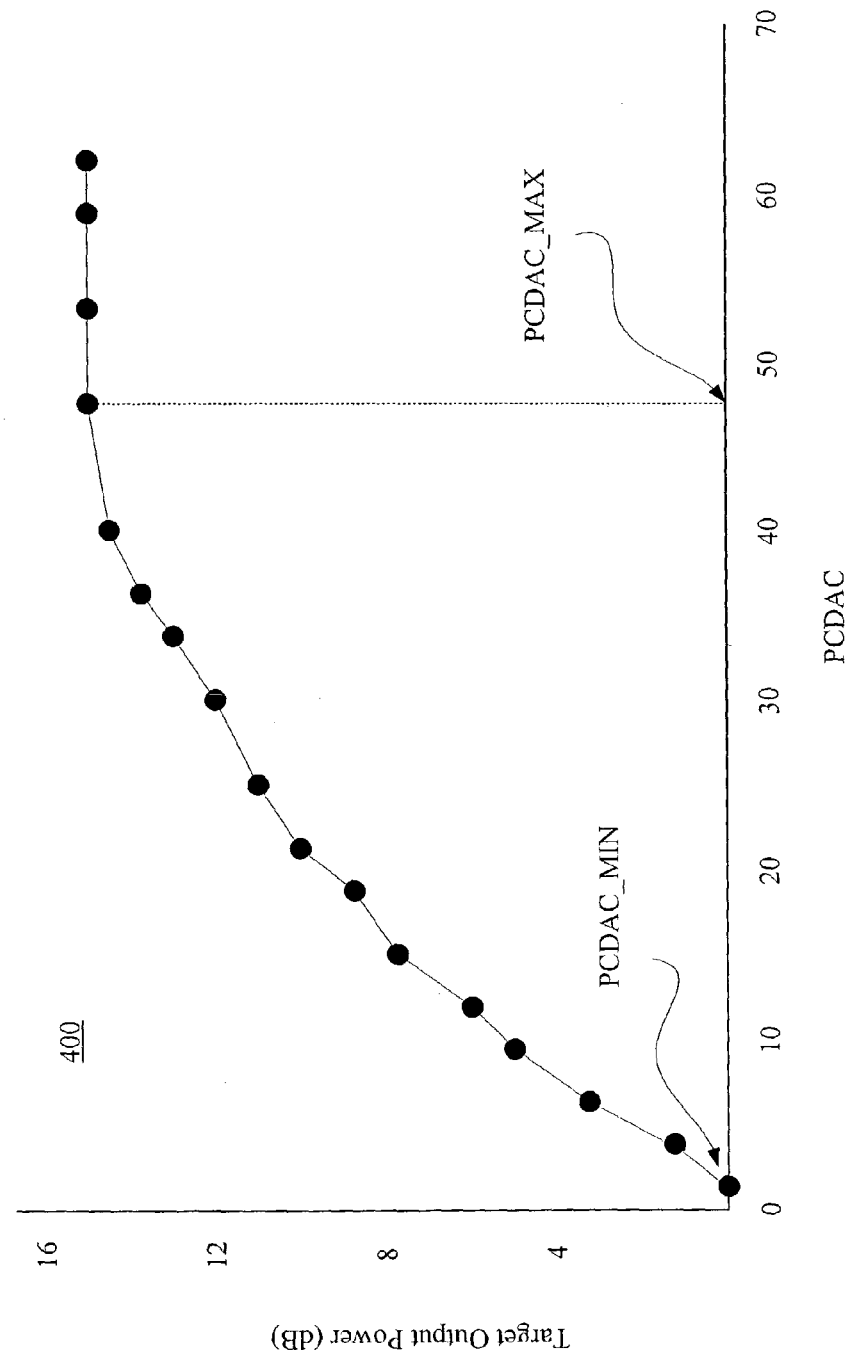
FIG. 4A illustrates a graph of PCDACs and their corresponding target, i.e. desired, output power, at one frequency pier.

FIG. 4A illustrates a graph 400 of PCDACs and their corresponding target, i.e. desired, output power, at one frequency pier. Note that the power versus PCDAC dependence typically provides negligible output below PCDAC_MIN, monotonic increase in output power up to PDDAC_MAX, beyond which the power amplifier saturates and therefore no increase in output power is observed. In one embodiment, only information regarding PCDACs between PCDAC_MIN and PDDAC_MAX are considered, thereby minimizing data to be stored.

Figure 4B:
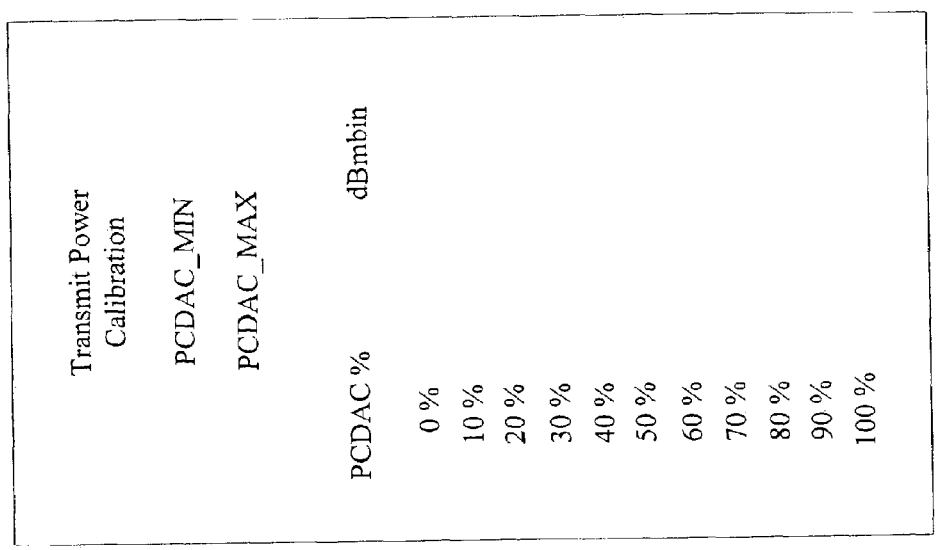
FIG. 4B illustrates an exemplary format of PCDAC data stored at a frequency pier.

In one embodiment that further compresses calibration data, the PCDAC_MIN and PCDAC_MAX values can be computed at each frequency pier. Then, output power can be interpolated at predetermined percentage intercepts. For example, an exemplary format of PCDAC data stored at a frequency pier is shown in FIG. 4B. Specifically, the values stored for each frequency pier can include PCDAC_MIN, PCDAC_MAX, and the interpolated output at fixed percentage intercepts of 0%, 10%, 20%, 30%, 40%, 50%, 60%, 70%, 80%, 90%, and 100%. Note that for 802.11b and OFDM (both operating at 2.4 GHz), a similar technique can be employed to store PCDAC data.

Note that the target power should be as high as possible to attain optimal range. However, if the target power is too aggressive, then more devices may fail testing, thereby reducing yield. Therefore, to improve yield, a device manufacturer may back off the target power, thereby sacrificing some range. However, the compacted calibration data, which is based on the performance of a particular device, can advantageously provide a level of accuracy that minimizes the amount of back off needed for the targeted power, thus maximizing the performance.

Piecewise Linear Abstraction: Computing Turning Points

In accordance with one aspect of the invention, a predetermined number of turning points or a certain accuracy using turning points can be computed to best represent a dependency. FIGS. 5A and 5B illustrate an exemplary technique for computing a set of turning points.

In general, any compression can result in some loss of accuracy. Therefore, in step 501, the uncompressed data can be measured with fine granularity to ensure that the resulting compressed data provides optimal accuracy. Alternatively, uncompressed data, which was measured with fine granularity, can be accessed in step 501. FIGS. 1 and 2 illustrate measured, i.e. uncompressed, data represented in a graphical format. Note that although the data described in reference to one embodiment show the dependency of power and frequency, other embodiments of the invention could apply to any set of data reflecting a dependency.

In step 502, the data can be processed to eliminate anomalous values, which could otherwise skew subsequent data analysis. This processing could include smoothing, filtering, deglitching, or any other similar process. In step 503, second derivatives of the curves representing the dependencies, with respect to the independent variable, can be computed. In one embodiment, computing the second derivative can be based on a sampling point as well as two points adjacent to that sampling point (that is, one sampling point before (called a leading point) and another sampling point after (called a trailing point)). In another embodiment, computing the second derivative can be based on a sampling point as well as four points adjacent that sampling point (that is, two leading points and two trailing points). Note that other embodiments could include any number of leading/trailing points.

In simple terms, a derivative indicates a rate of change. Thus, for example, the derivative of a horizontal line would be zero. FIGS. 6A-6C illustrate exemplary first and second derivations of various dependencies.

FIG. 6A illustrates a first dependency (shown on the left most side) with variables 1 and 2. This first dependency is shown graphically as a straight line having an upward slope. Therefore, the first derivative of the first dependency (shown in the middle) would be a constant positive value and the second derivative (shown on the right most side) would be a constant value of zero (note that a dotted line in the graphs indicates a value of zero).

FIG. 6B illustrates a second dependency 600 having a sinusoidal shape. The first derivative of second dependency 900 includes a point 601 (which indicates that a first portion of dependency 600 has a positive slope and therefore its first derivative is a constant positive value), a point 602 (which indicates that the second portion of dependency 600, i.e. its apex, has a constant value, and therefore its first derivative is a constant zero value), and a point 603 (which indicates that a third portion of dependency 600 has a negative slope and therefore its first derivative is a constant negative value). The second derivative of second dependency 600 includes points 604, 605, and 606 that roughly correspond to points 601, 602, and 603, respectively. Specifically, because the portions of the curves including points 601 and 603 represent substantially constant values (positive and negative, respectively), then the derivatives of those portions of the curves, which include points 604 and 606, can be represented by substantially constant zero values. The portion of the curve including point 602 changes from a negative to positive slope. Therefore, the derivative of that portion of the curve can be represented by a curve having a steep positive slope followed by a steep negative slope.

FIG. 6C illustrates a third dependency 610 having two substantially horizontal portions connected by a steep positive slope portion. The first derivative of third dependency 610 includes points 611 and 613 (which indicates that first and last portions of dependency 610 have a substantially positive value and therefore their first derivative can be represented by a constant zero value). The first derivative of third dependency 910 further includes a point 612, which indicates that the middle portion of dependency 610 (i.e. its transition from one constant positive value to a second higher constant positive value) quickly increases to a high value, then quickly decreases to zero. The third derivative of second dependency 900 includes points 614, 615, and 616 that roughly correspond to points 611, 612, and 613, respectively. The portion of the curve from points 611 to 612 goes from a zero slope to a high positive slope back to a zero slope. Therefore, the derivative of this portion can be represented by curve having a steep positive slope followed by a steep negative slope curve (the curve having a positive value apex). In a similar analysis, the portion of the curve from points 612 to 613 changes from a zero slope to a high negative slope back to a zero slope. Therefore, the derivative of that portion of the curve can be also be represented by a curve having a steep negative slope followed by a steep positive slope (the curve having a negative value apex). Note that the computation of the second derivative from a curve, i.e. the dependency, although resource intensive, need only be performed once for each device.

Figure 7:
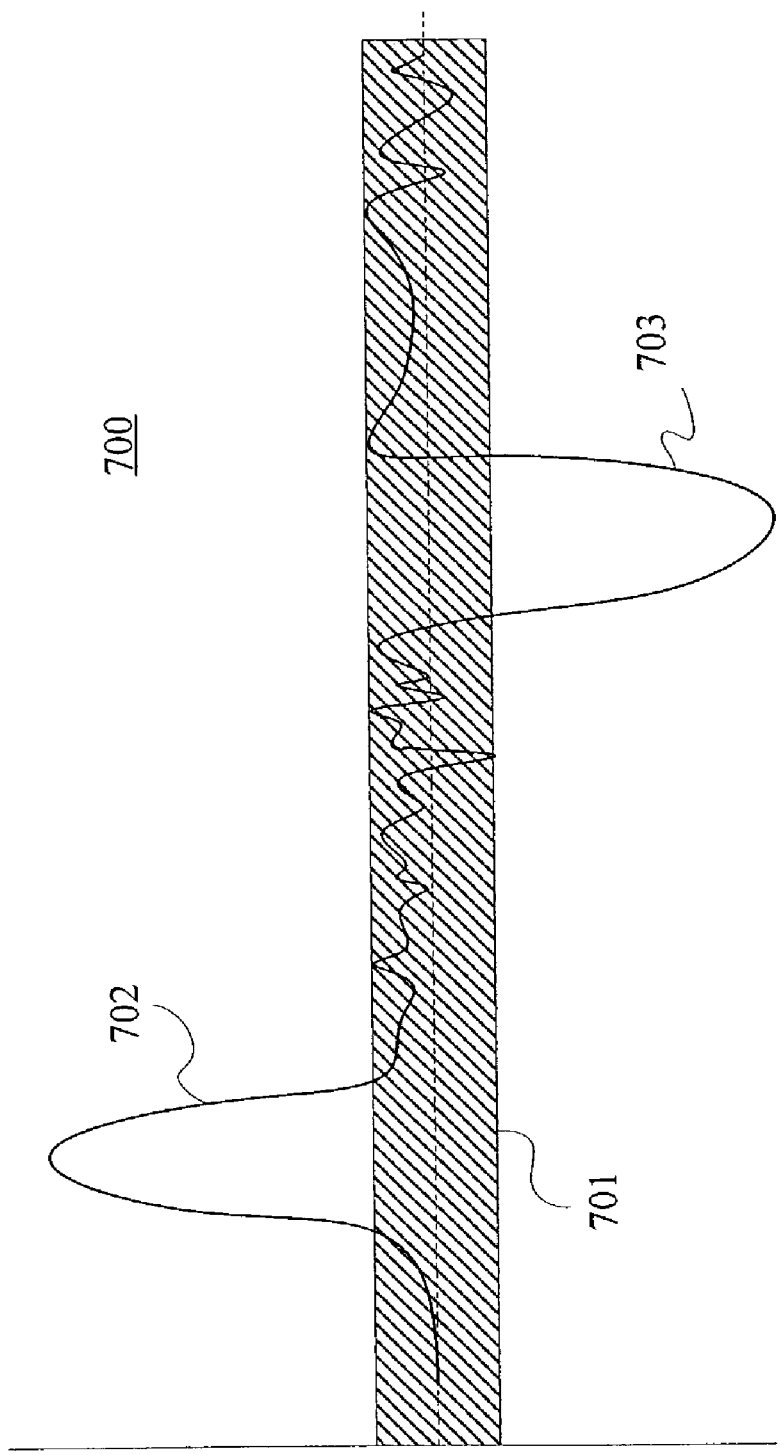
FIG. 7 illustrates an exemplary graph of second derivative values, wherein a band of small extrema values can be filtered out to leave only significant extrema.

Referring back to FIG. 5A, small extrema of second derivative values can be filtered out (i.e. ignored). Extrema are created whenever a change of direction occurs in the values of the second derivative. For example, FIG. 7 illustrates an exemplary graph 700 of second derivative values, wherein a band 701 of small extrema values can be filtered out to leave significant extrema 702 and 703. The distinction between small and significant extrema can be based on a grid size in the original data graph. That is, in one embodiment, a +/−0.5 dB fluctuation can be considered a "don't care." This range of fluctuation can be used to compute the positive/negative threshold (centered on zero) in the second derivative.

In step 505, a sorted list of significant extrema values can be made. In step 506, the significant extrema from various curves, if present, can be consolidated into piers. For example, in the case of a set of curves, certain significant extrema could be close enough to one variable value to be grouped together. In one embodiment, the criteria for determining whether two significant extrema are close enough to be grouped together can be set by a user. For example, in the case of a dependency of frequency and power, a user could determine that if two significant extrema are within a predetermined frequency range, then those significant extrema should be grouped together. In one embodiment, the predetermined frequency range could be approximately 20-50 MHz.

In step 507 (FIG. 5B), the extrema can be checked to determine whether they satisfy the criteria to be considered for selection as a turning point. One possible criterion could be a peak magnitude of the extrema in the second derivative to be larger than a minimum threshold that could be computed based on the maximum tolerable error and the grid step of the sampling points of the independent variable. If the significant extrema fail to satisfy the criteria, then the process ends for that extremum.

If the significant extrema satisfy the criteria, then an appropriate cost function can be computed in step 508. In accordance with one feature of the invention, this cost function can be applied to each significant extrema in each curve. In one embodiment, the cost function can determine the cost of not using that significant extrema as a turning point. A simple cost function could be the error metric at that extremum if it were interpolated from the 2 neighboring, leading and trailing, extrema. Possible error metrics include the absolute magnitude of the error or the square of the error. For the case of a set of dependencies, the error metrics can be added for all the dependencies in the set at the extremum in consideration. At this stage, it is also possible to weigh the error metric from various dependencies in the set differently, thereby imparting more importance to some dependencies over others in the set.

In step 509, the significant extrema can be sorted by their cost function. As mentioned with respect to FIG. 1, turning points can be generated based on a predetermined number of turning points, i.e. max_num, or on a predetermined accuracy provided by the turning points, i.e. min_accuracy, as set by a user. In one embodiment, a max_num value of 10 is determined to provide significant compression while optimizing accuracy.

In step 510, a determination can be made whether the max_num or min_accuracy criteria was set. If the min_accuracy criterion was set, then the necessary number N of the highest cost extrema required to provide the desired accuracy can be designated as turning points in step 511. If the max_num criterion was set, then a max_num number (e.g. 10) of highest cost extrema can be designated as turning points in step 512.

In accordance with one feature of the invention, this highly compacted calibration data can be stored in a memory of the wireless device. In one embodiment, if the wireless device is an access point, then the memory could be a flash memory. In another embodiment, if the wireless device is a client, then the memory could be an EEPROM.

Thus, a storage device readable by a driver can be provided to store calibration data regarding a wireless device. The storage device can store compressed data representing a plurality of sampling points. Of importance, the data can be compressed using a method including one or more steps shown in FIGS. 5A and 5B. For example, the method can include computing second derivatives from the plurality of sampling points, thereby generating a plurality of extrema, computing cost functions for the extrema, sorting the extrema based on the cost functions, and selecting a set of the extrema based on either a predetermined number of turning points or a level of accuracy to be provided by the set.

A computer program product in accordance with one embodiment of the invention can also be provided. The computer program product can include a computer usable medium having a computer readable program code embodied therein for causing a computer to compress data regarding a wireless device. The computer readable program code can include computer readable program code that accesses data including a plurality of sampling points, computer readable program code that computes second derivatives from the plurality of sampling points, thereby generating a plurality of extrema, computer readable program code that computes cost functions for the extrema, computer readable program code that sorts the extrema based on the cost functions, and computer readable program code that selects a set of the extrema based on one of a predetermined number of turning points and an accuracy to be provided by the set.

In one embodiment, the data can include a plurality of curves, wherein each curve can represent a dependence of a independent variable and a dependent variable. In this case, the computer program product can further include computer readable program code that forms piers at certain values of the independent variable. In another embodiment, the computer program product can further include computer readable program code that processes the data to exclude anomalous sampling points before computing the second derivatives. In yet another embodiment, the computer program product can further include computer readable program code that filters out insignificant extrema before computing the cost functions, thereby leaving significant extrema to be sorted.

A system for compressing calibration data regarding a wireless device can also be provided. The system can include means for accessing data including a plurality of sampling points, means for computing second derivatives from the plurality of sampling points, thereby generating a plurality of extrema, means for computing cost functions for the extrema, means for sorting the extrema based on the cost functions, and means for selecting a set of the extrema based on one of a predetermined number of turning points and an accuracy to be provided by the set.

Compaction of Data Using Mapping

In accordance with another feature of the invention, a mapping technique can be used to compress and store data. In one embodiment, the data can include conformance testing limits (CTLS) for a wireless device. A CTL refers to data representing output power as well as band edge limits determined by conformance testing. The band edge limits refer to rules used to measure the edges of the frequency bands.

Figure 8:
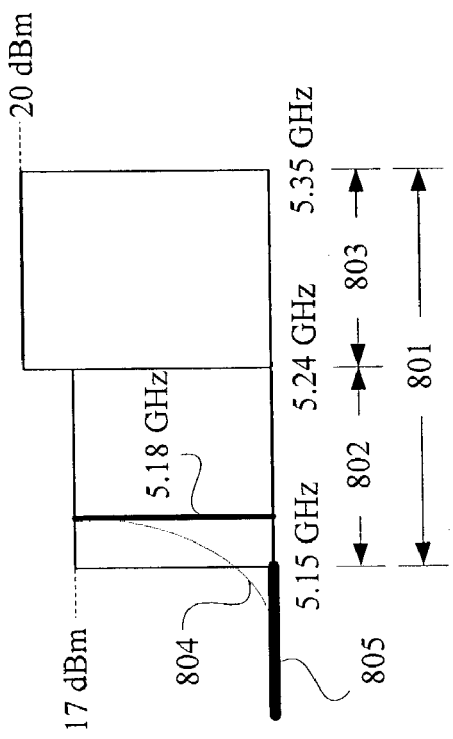
FIG. 8 illustrates an exemplary open band from 5.15 GHz to 5.35 GHz.

FIG. 8 illustrates an exemplary open band 801 from 5.15 GHz to 5.35 GHz (note that bands are typically 20 GHz wide). Band 801 includes two frequency ranges 802 and 803 governed by common power restrictions. In this example, a device operating in frequency range 802, i.e. from 5.15 to 5.24 GHz, should have a maximum power transmission of 17 dBm, whereas a device operating in frequency range 803, i.e. from 5.24 to 5.35 GHz, should have a maximum power transmission of 20 dBm.

In one embodiment, to maximize the number of regulatory domains that can be supported by the driver while minimizing storage resources, the CTL information (also called a compressed CTL) can convey restrictions for multiple regulatory domains. As used herein, a regulatory domain refers to band edges, in-band frequencies, target power levels (i.e. maximum transmit power levels for particular card types), and conformance testing limits applicable to a country or region.

Figure 9:
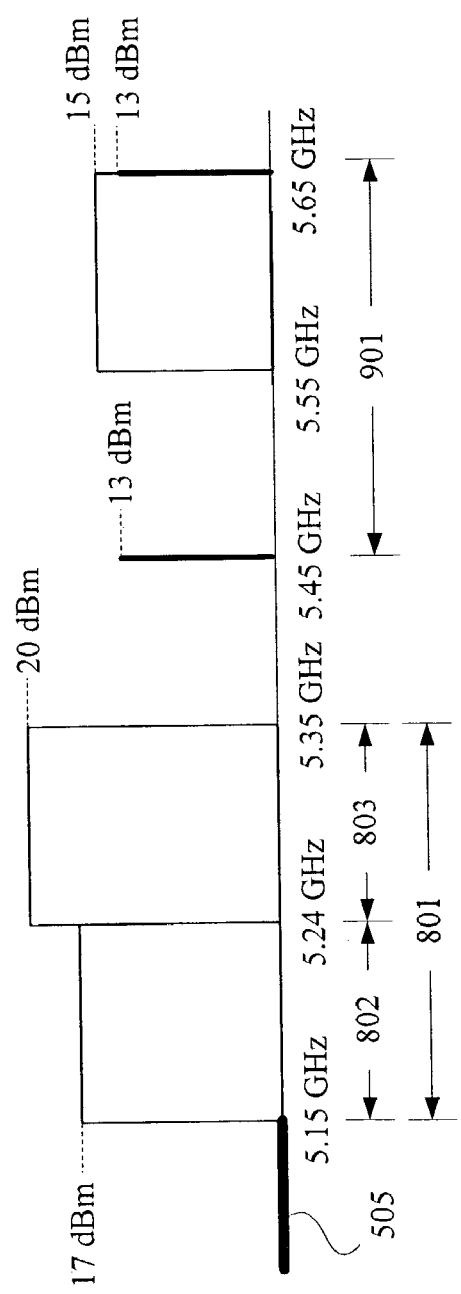
FIG. 9 illustrates exemplary non-overlapping regulatory domain information including a first open band from 5.15 GHz to 5.35 GHz for a first regulatory domain and a second open band from 5.45 GHz to 5.65 GHz for a second regulatory domain.

In one embodiment, for optimal CTL compression, the bands associated with those regulatory domains can be either completely overlapping or non-overlapping. Completely overlapping means that the bands share the same frequencies as well as adjacent restricted band regulations (described below). Non-overlapping means that no portions of the bands, even the edges, overlap. For example, FIG. 9 illustrates exemplary non-overlapping regulatory domain information including open band 801 from 5.15 GHz to 5.35 GHz for a first regulatory domain and another open band 901 from 5.45 to 5.65 for a second regulatory domain.

In accordance with one feature of the mapping technique, a band can be represented as a pair of frequencies, i.e. the extreme lower and upper edge frequencies of the band (called band edges). Thus, band edges appear in pairs. Moreover, the first frequency in the compressed CTL is a band edge as is the last frequency (although not necessarily for the same band). In some cases, regulatory stipulations imposed outside the band may restrict power output at not only the band edges, but also for some frequencies/channels within the band (called in-band frequencies). In-band frequencies are specified only within a pair of starting and ending band edges.

Table 1 illustrates an exemplary set of data representing a compressed CTL including information for multiple band edges and in-band frequencies. In this embodiment, frequencies specified in the compressed CTL can be arranged in an increasing order. (Note that in other embodiments, the frequencies can be arranged in a decreasing order, as long as the driver knows the order being used.)

TABLE 1

Exemplary Compressed Conformance Testing Limit

|  | Band Edge I | In-Band Freq I | In-Band Freq II | In-Band Freq III | In-Band Freq IV | Band Edge II | Band Edge III | Band Edge IV |
|---|---|---|---|---|---|---|---|---|
| CTL Freq | 5400 | 5420 | 5460 | 5540 | 5580 | 5600 | 6000 | 6100 |
| CTL Limit | 12 | 13 | 13 | 12.5 | 12.5 | 12 | 14 | 14 |
| Non-Edge Flag | 0 | 1 | 1 | 1 | 1 | 0 | 0 | 0 |

As shown in Table 1, a non-edge flag can be used to designate whether a value represents a band edge (e.g. 0) or an in-band frequency (e.g. 1). In the compressed CTL of Table 1, a band exists from 5400-5600 MHz, as indicated by band edges I and II. Out of band regulations require the power be limited to 12 dBm at the band edges (i.e. CTL limits for band edges I and II), 13 dBm for 5420-5460 MHz (i.e. CTL limits for in-band frequencies I and II), and 12.5 dBm for 5540-5580 MHz (i.e. CTL limits for in-band frequencies III and IV). As previously described, one or more additional bands can be represented in the same compressed CTL as long as the frequencies do not overlap. Thus, in Table 1, the start of another band can be represented by band edge III, which requires power to be limited to 14 dBm (i.e. the CTL limit for band edge III) for 6000 MHz (wherein 6000 MHz does not overlap with the previous open band having a frequency range of 5400-5600 MHz). In one embodiment, up to eight frequencies, whether edge frequencies or in-band frequencies, can be stored by one compressed CTL.

Table 2 illustrates an exemplary set of data representing another compressed CTL.

TABLE 2

Exemplary Compressed Conformance Testing Limit

|  | Previous Band | Band Edge I | In-Band Freq I | Band Edge II | Next Band |
|---|---|---|---|---|---|
| CTL Freq | 5200 | 5400 | 5420 | 5500 | 6000 |
| CTL Limit | 16 | 13 | 15 | 12 | 13 |
| Non-Edge Flag | 0 | 0 | 1 | 0 | 0 |

In Table 2, an open band exists from 5400-5500 MHz. Out-of-band regulations require the power be limited to 13 dBm at the starting band edge (i.e. the CTL limit for band edge I), 15 dBm for 5420-5500 MHz (i.e. the CTL limit for in-band frequency I), and 12 dBm at the ending band edge (i.e. the CTL limit for band edge II). In this example, the in-band frequency I does not have an associated in-band frequency. In this case, the CTL limit of the in-band frequency can be applied up to, but excluding, the ending band edge (band edge II), wherein the CTL limit of that band edge then applies. Note that band 601 (FIG. 6) graphically represents an open band having a single in-band frequency.

Note that a device can be pre-programmed with its appropriate regulatory domain or can be configured to the appropriate regulatory domain based on a beacon transmitted by an access point or another station. U.S. patent application Ser. No. 10/330,486, now U.S. Pat. No. 7,103,314, entitled, "System And Method Of Conforming Wireless Devices To Worldwide Regulations", filed on Dec. 27, 2002 and issued on Sep. 5, 2006, which is incorporated by reference herein, describes techniques that can be used to extract relevant information from any beacon to determine the appropriate regulatory domain for wireless communication.

In accordance with one feature of the invention, the driver of a wireless device can store a mapping of each regulatory domain to its associated compacted CTL as well as the allowed bands/channels and their associated maximum regulatory power limits in their regulatory domains. In one embodiment, such information can be encoded as a look-up table (LUT). Note that although a substantially comprehensive set of CTLs can be programmed at manufacturing calibration, supporting new frequency allocations in various regulatory domains or changes in regulations in the existing regulatory domains can be advantageously performed using software updates.

In summary, a mapping technique for compressing conformance testing limit (CTL) data has described. The method can include representing each band of a regulatory domain as a pair of band edges. In-band frequencies, if present, can be designated within each band. Of importance, at least two non-overlapping regulatory domains can be provided in the CTL. In one embodiment, the method can further include providing at least two completely overlapping regulatory domains in the CTL. By providing non-overlapping regulatory domains and/or completely overlapping regulatory domains, multiple regulatory domains can be advantageously mapped to the same CTL. Designating an in-band frequency can include providing a non-edge flag value different than that for a band edge.

A storage device that stores conformance testing limit (CTL) data can also be provided. In this storage device, the CTL data includes at least two non-overlapping regulatory domains, wherein each band of a regulatory domain can be represented as a pair of band edges and in-band frequencies can be represented within each band. In one embodiment, further compression can be achieved by including at least two completely overlapping regulatory domains in the CTL.

A computer program product that includes computer readable program code for causing a computer to compress conformance testing limit (CTL) data for a wireless device can also be provided. The computer readable program code can include computer readable program code that represents each band of a regulatory domain as a pair of band edges, computer readable program code that designates in-band frequencies within each band, and computer readable program code that provides at least two non-overlapping regulatory domains in the CTL. In one embodiment, the computer program product can further include computer readable program code that provides at least two completely overlapping regulatory domains in the CTL.

A system for compressing conformance testing limit (CTL) data for a wireless device can also be provided. The system can include means for representing each band of a regulatory domain as a pair of band edges, means for designating in-band frequencies within each band, and means for providing at least two non-overlapping regulatory domains in the CTL.

Determining Optimal Transmit Power

Referring back to FIG. 8, various regulatory domains have restricted bands (e.g. bands for the military or government) interspersed with the frequency bands open for public infrastructure. A black bar 805, which is provided immediately adjacent the lower edge of band 801, represents such a restricted band. Unfortunately, the maximum power transmission information does not reflect power leakage considerations. Specifically, even if a device is operating away from the band edge at, for example, 5.18 GHz, some power leakage can occur as shown by curve 804. In other words, for this power emission, most of the power would remain within the desired band; however, some power will leak through. This power leakage is called an "envelope" or "spectral mask". Thus, special consideration is needed to determine the transmit power at the band edges to ensure no transmission occurs in the restricted band.

To ensure the device generates no transmission in the restricted band, either the frequency or the power of the device could be changed. Specifically, the device could be adjusted to operate at a higher frequency, thereby ensuring that curve 804 is contained within frequency range 802. In another embodiment, and more typically, the device could be adjusted to operate at a lower power. In this manner, the slope of its leakage curve would be steeper than that of curve 804, thereby once again ensuring that the leakage curve is contained within frequency range 802.

Of importance, this power adjustment information varies from one wireless device to another. In other words, one device may need to have more power adjustment than another device to conform to the regulations. Therefore, in accordance with one aspect of the invention, the wireless device can store this adjustment information in its memory as part of its calibration data.

Figure 10:
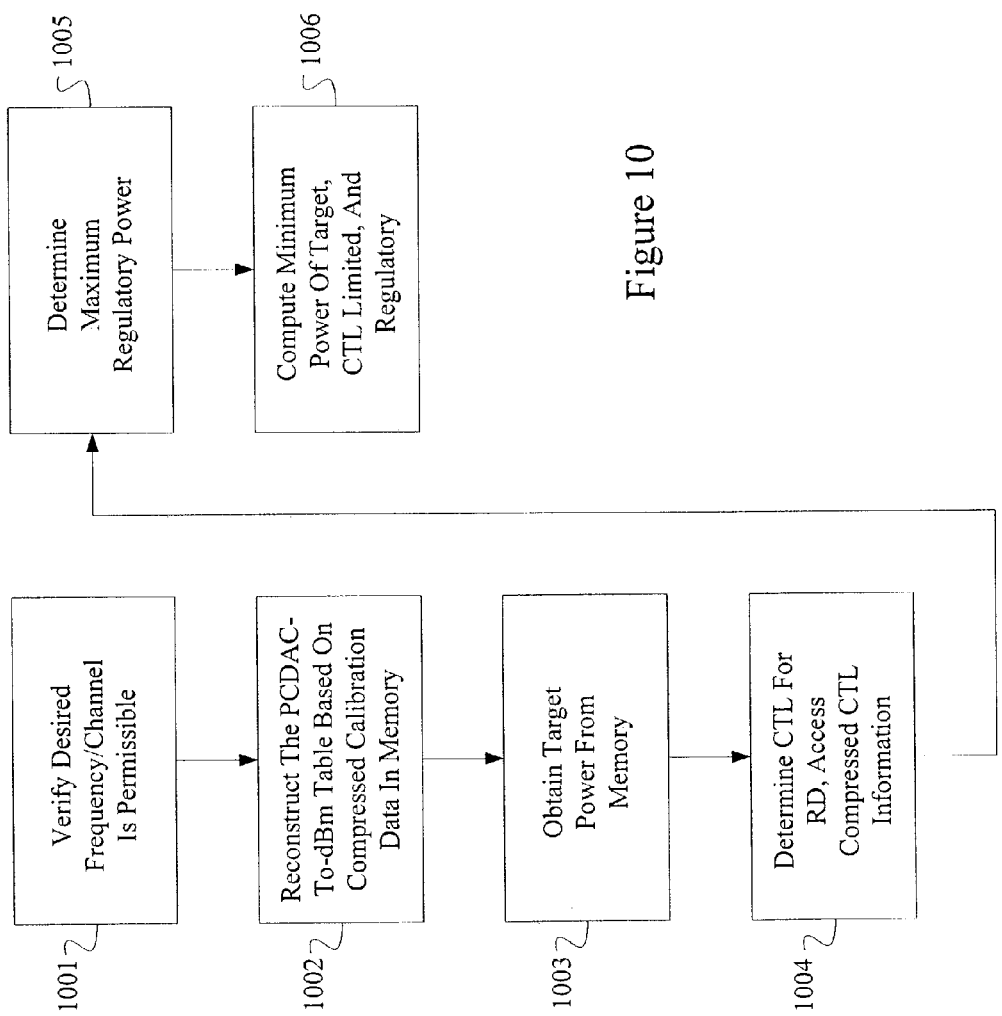
FIG. 10 illustrates an exemplary technique for determining the optimal transmit power that should be used by a specific device at a specific frequency.

FIG. 10 illustrates an exemplary technique for determining the optimal transmit power used by a specific device at a specific frequency. In step 1001, the desired frequency of the device can be verified as permissible for the regulatory domain in which the device is currently operating. Otherwise, in one embodiment, transmission of the device cannot be initiated at this frequency. In step 1002, the driver can reconstruct the PCDAC-to-dBm table (see FIG. 4B) based on the compressed calibration data stored in memory. This table can be temporarily stored in the same memory. In step 1003, the target power (i.e. the maximum power for that type of device) for each rate at the current frequency can be obtained from data also stored in memory. In step 1004, after determining the appropriate CTL for the regulatory domain (which can be determined by the driver using a LUT), the expanded CTL information (stored in memory) can be accessed. The maximum allowable power, taking into account band edge considerations, for the desired frequency can then obtained in step 1005. In step 1006, the minimum of the target power (step 1003), the CTL limited power (step 1004) and the regulatory power (step 1005), can be computed and assigned as the transmit power for that device at the desired frequency.

Manufacturing Test Flow

After calibration is complete, a user can test the compressed data for accuracy. Specifically, the user can request the wireless device to reproduce power based on the compressed data. In one embodiment, if the power is within 0.5 dB, then the compressed data is characterized as accurate.

Applications for Piecewise Linear Abstraction and Mapping

Although the above-described embodiments describe the dependency of output power over a frequency range, the use of piecewise linear abstraction can be equally applied to other dependencies and, even more broadly, to other technologies. For example, the piecewise linear abstraction techniques could be applied to any type of machine control, the biomedical field, or any dependency that generates a significant volume of empirical data. Similarly, the use of mapping can be applied to other technologies.

Moreover, although the exemplary embodiments are "two-dimensional" dependencies (i.e. one independent variable and one dependent variable), other embodiments could refer to "three-dimensional" dependencies (i.e. two independent variables and one dependent variable). For example, in other embodiments, another variable such as voltage, current, time, temperature, etc. could be used.

OTHER EMBODIMENTS

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following Claims and their equivalents.

The invention claimed is:

1. A method of data compaction, the method including:
using computer readable program code embodied in a computer usable medium, the computer readable program code for performing steps including:
accessing data including a plurality of sampling points;
computing second derivatives of the data for generating a plurality of extrema from the plurality of sampling points;
computing cost functions for the plurality of extrema;
sorting the plurality of extrema based on the cost functions;
selecting a set of the sorted plurality of extrema based on one of a predetermined number of extrema and a level of accuracy to be provided by the set; and
using the set of the sorted plurality of extrema to indicate turning points, thereby providing the data compaction.

2. The method of claim 1, wherein accessing includes measuring the data.

3. The method of claim 1, further including processing the data to exclude anomalous sampling points before computing the second derivatives.

4. The method of claim 3, wherein processing includes at least one of smoothing the data, filtering the data, and deglitching the data.

5. The method of claim 3, further including:
filtering out small extrema before computing the cost functions, thereby leaving significant extrema to be sorted.

6. The method of claim 5, further including consolidating significant extrema from multiple curves.

7. The method of claim 5, wherein the data includes a plurality of curves, each curve representing a dependence of a dependent variable on an independent variable.

8. The method of claim 7, further including forming piers at certain values of the independent variable.

9. The method of claim 8, wherein the data includes calibration information for a wireless device.

10. The method of claim 8, wherein the dependent variable is power and the independent variable is frequency.

11. The method of claim 10, wherein each curve represents a PCDAC (power control digital-to-analog converter).

12. A storage device including data representing a plurality of sampling points, the data being compact using a method comprising:
computing second derivatives from the plurality of sampling points for generating a plurality of extrema;
computing cost functions for the plurality of extrema;
sorting the plurality of extrema based on the cost functions;
selecting a set of the sorted plurality of extrema based on one of a predetermined number of turning points and an accuracy to be provided by the set; and
using the set of the sorted plurality of extrema to indicate turning points, thereby facilitating data compaction.

13. The storage device of claim 12, wherein the storage device includes an EEPROM (electrically erasable programmable read-only memory).

14. The storage device of claim 12, wherein the storage device include a flash memory.

15. The storage device of claim 12, wherein the data includes calibration data regarding a wireless device.

16. A computer program product comprising:
a computer readable medium having a computer readable program code embodied therein for causing a computer to compact data regarding a wireless device, the computer readable program code comprising:
computer readable program code that accesses data including a plurality of sampling points;
computer readable program code that computes second derivatives from the plurality of sampling points for generating a plurality of extrema;
computer readable program code that computes cost functions for the plurality of extrema;
computer readable program code that sorts the plurality of extrema based on the cost functions;

computer readable program code that selects a set of the sorted plurality of extrema based on one of a predetermined number of turning points and an accuracy to be provided by the set; and computer readable program code that uses the set of the sorted plurality of extrema to indicate turning points, thereby allowing data compaction.

17. The computer program product of claim 16, wherein the data includes a plurality of curves, each curve representing a dependence at a different parameter value, wherein the computer program product further includes computer readable program code that forms piers based on values of extrema from the plurality of curves.

18. The computer program product of claim 17, further including computer readable program code that processes the data to exclude anomalous sampling points before computing the second derivatives.

19. The computer program product of claim 18, further including computer readable program code that filters out insignificant extrema before computing the cost functions, thereby leaving significant extrema to be sorted.

* * * * *